United States Patent [19]
Kobayashi et al.

[11] Patent Number: 5,395,452
[45] Date of Patent: Mar. 7, 1995

[54] APPARATUS MADE OF SILICA FOR SEMICONDUCTOR DEVICE FABRICATION

[75] Inventors: Masanori Kobayashi; Ken Yamazaki; Tsutomu Ogawa; Yoshiko Okui, all of Kawasaki, Japan

[73] Assignee: Fujitsu Limited, Kawasaki, Japan

[21] Appl. No.: 77,645

[22] Filed: Jun. 17, 1993

[30] Foreign Application Priority Data

Jun. 19, 1992 [JP] Japan .................................. 4-161462
Mar. 19, 1993 [JP] Japan .................................. 5-060342

[51] Int. Cl.⁶ ............................................. C23C 16/00
[52] U.S. Cl. ................................. 118/715; 118/726; 118/728
[58] Field of Search ................ 266/256; 118/715, 726, 118/728

[56] References Cited

U.S. PATENT DOCUMENTS

| | | | |
|---|---|---|---|
| 4,317,668 | 3/1982 | Susa et al. | 65/29 |
| 4,664,747 | 5/1987 | Sekiguchi et al. | 156/643 |
| 4,830,982 | 5/1989 | Dentai et al. | 437/94 |
| 5,119,761 | 6/1992 | Nakata | 118/725 |

FOREIGN PATENT DOCUMENTS

| | | |
|---|---|---|
| 0046355 | 2/1982 | European Pat. Off. . |
| 55-126542 | 9/1980 | Japan . |
| 63-236723 | 10/1988 | Japan . |
| 3-84922 | 4/1991 | Japan . |
| WO-88/05836 | 8/1988 | WIPO . |

OTHER PUBLICATIONS

Database WPI Week 9135, Derwent Publications Ltd., London, GB; AN 91-258087 & JP-A-3170 340 (Shin--Etsu) 23 Jul. 1991.

*Primary Examiner*—Olik Chaudhuri
*Assistant Examiner*—Brian K. Dutton
*Attorney, Agent, or Firm*—Staas & Halsey

[57] ABSTRACT

In a apparatus made of silica such as a heating furnace, a wafer basket, stick or the like used for semiconductor device fabrication, a first silica layer on the side faced to a semiconductor wafer contains a large amount of the OH group, and a second silica layer on the opposed side contains a small amount of the OH group. With this structure, it is possible to reduce the amount of impurities released through the first silica layer, and to suppress the deformation of the apparatus by the second silica layer. Also, by holding a third silica layer between the first and second silica layers, it is possible to further reduce the amount of impurities released from the first silica layer.

36 Claims, 8 Drawing Sheets 5,6:

APPARATUS MADE OF SILICA FOR SEMICONDUCTOR DEVICE FABRICATION

BACKGROUND OF THE INVENTION

1. Field of the Invention

The present invention relates to a apparatus made of silica for semiconductor device fabrication, and particularly to a apparatus made of silica such as a furnace tube, wafer boat or stick used for fabricating semiconductor devices.

2. Description of the Related Art

With the progress of the high integration for semiconductor integrated circuit devices, there has been required such a fabrication process as to exclude the contamination causing the deterioration in the device characteristics. An clean atmosphere without any metal contamination caused by alkali metals such as Na and K, and transition metals such as Fe and Cr is required for a fabrication process for semiconductor devices.

In particular, in a heat treatment process over about 900° C., if a semiconductor wafer is exposed to an atmosphere containing contaminated metals, the metals tend to be introduced in the semiconductor wafer, resulting in the deterioration of the semiconductor device fabricated using the semiconductor wafer.

Accordingly, the materials for jigs used in the heat treatment process particularly require high purity, that is, the reduction in the amount of metal impurities contained therein.

In a heat treatment process for a semiconductor wafer used as a substrate of a semiconductor device and in a film deposition process for forming films on the surface thereof, jigs made of silica, SiC and the like are used. These materials are also required to be reduced in the contents of the impurities.

As a furnace tube used in a film deposition apparatus and a heater, there is used such a cylindrical silica tube c as shown in FIGS. 1(A) and 1(B). The silica tube c contains a wafer boat made of silica b mounting a semiconductor wafers w.

For fabricating a silica constituting the silica tube c or the wafer boat b, there have known two methods: (1) an electrical fusion method; and (2) a oxyhydrogen flame fusion method. These methods are similar to each other in using natural silica rock or silica sand as the raw material.

The silica formed by the oxyhydrogen flame fusion method is worse in the heat resistance and tends to be deformed by the applying of heat. The electrical fusion method has been developed for solving the disadvantage of the oxyhydrogen flame fusion method. The silica formed by the electrical fusion method is,excellent in the heat resistance.

The reason for this is that the amount of the hydroxyl group (OH group) contained in the silica formed by the electrical fusion method is smaller than that contained in the silica formed by the oxyhydrogen flame fusion method. The detail has been reported, for example, in "NEW GLASS" No. 14. 1987 (New Glass Forum), "Industrial Material": The Daily Industrial News, September 1974.

The above two methods produce the silica using the natural silica rock or silica sand as the raw material. The silica thus obtained contains contaminated elements in a large amount. Accordingly, it is required to suppress the release of these contaminated elements to the outside of the silica.

A technique for suppressing the release of the contaminated elements has been proposed in Japanese Patent Laid-open Nos. sho 55-126542 and hei 3-84922. In this technique, a silica tube is so constructed that a high purity synthesis silica layer by vapor deposition is formed on the inner peripheral surface of a hard silica tube formed by the electrical fusion method. This is intended to prevent the internal diffusion of impurities by the synthesis silica layer.

However, the synthesis silica layer is small in the content of impurities but is large in the content of the OH group. As a consequence, the synthesis silica layer is small in its viscosity and is worse in the heat resistance, thus causing such an inconvenience that it tends to be fused to the other members when exposed to high temperatures.

Also, in Japanese Patent Laid-open No. sho 63-236723, there has been proposed a structure that a surface layer containing an aluminum element is formed on the outer peripheral surface of the silica tube formed by the electrical fusion method. This is intended to obstruct the permeation of the impurities from the outside by the surface layer.

SUMMARY OF THE INVENTION

It is therefore an object of the present invention to provide a apparatus made of silica, used for semiconductor device fabrication, capable of making it difficult to be deformed, of sufficiently suppressing the diffusion of contaminated metals to the inside and the release thereof to the outside, and eliminating the fusion with the other members under high temperatures.

According to the present invention, the content of the OH group in a first silica layer on the side faced to a semiconductor wafer is made larger, while the content of the OH group in a second silica layer on the opposed side is made smaller. With this structure, is possible to make difficult the deformation, and to significantly reduce the amount of the impurities released to the outside through the first silica layer. This is because the diffused amount of the contaminated metals is restricted by a large amount of the OH group.

Also, even if a wafer basket and the like is contacted with the silica layer on the side faced to the semiconductor wafer under high temperatures, they are never fused to each other.

Further, a third silica layer is interposed between the first and second silica layers, wherein the content of the OH group contained in the third silica layer is made larger than that of the first silica layer. Thus, the impurities permeating from the outside and reaching the first silica layer are entrapped by the third silica layer. This makes it possible to prevent the diffusion of the impurities into the first silica layer, and hence to further reduce the released amount of the impurities from the apparatus made of silica.

The first silica layer is formed by the oxyhydrogen flame fusion method, the second silica layer is formed by the electrical fusion method, and the third silica layer is formed by the vapor deposition method.

DESCRIPTION OF THE PREFERRED EMBODIMENTS

Prior to the description of the preferred embodiments, there will be described the results of examining the OH group and the released amount of metal impurities contained in a silica formed by each of the methods: (1) the oxyhydrogen flame fusion method, (2) the electrical fusion method, and (3) a vapor deposition method.

The silica formed by the oxyhydrogen flame fusion method contains the OH group in an amount of about 200 ppm or more. The silica formed by the electrical fusion method contains the OH group in a small amount of 30 ppm or less. Further, the synthesis silica formed by the vapor deposition method contains the OH group in a large amount ranging from several hundreds to several thousands of ppm.

Each silica formed by the oxyhydrogen flame fusion method and the electrical fusion method is examined for the metal impurities, which gives the results as shown in Table 1. As shown in Table 1, there is no significant difference therebetween.

TABLE 1

| METAL ELEMENT | Fe (ppb) | Cu (ppb) | Cr (ppb) | Ni (ppb) | OH (ppm) |
|---|---|---|---|---|---|
| FLAME FUSED SILICA | 74 | <7 | <10 | <3 | 200 |
| ELECTRICAL FUSED SILICA | 57 | <7 | <10 | <3 | 15.3 |

Next, each silica formed by the oxyhydrogen flame fusion method and the electrical fusion method is examined for the metal impurities released therefrom in high temperatures.

Figure 1A:
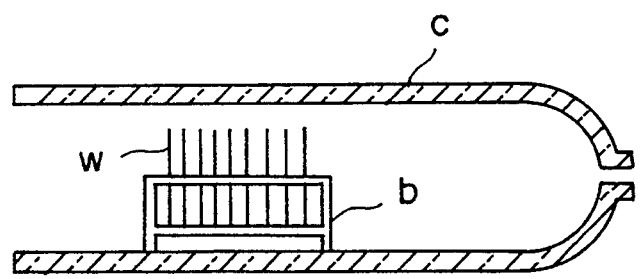
FIGs. 1(A) and 1(B) are sectional views each showing one example of prior art apparatuses.
Figure 1B:
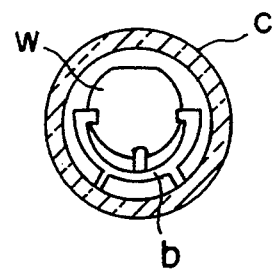
Figure 2A:
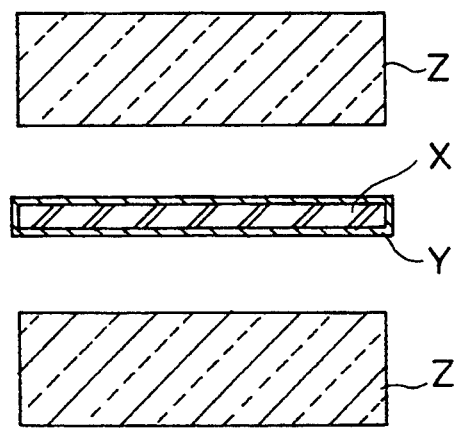
FIGS. 2(A) and 2(B) are sectional views each showing a method for examining the amount of impurities released from a silica layer.
Figure 2B:
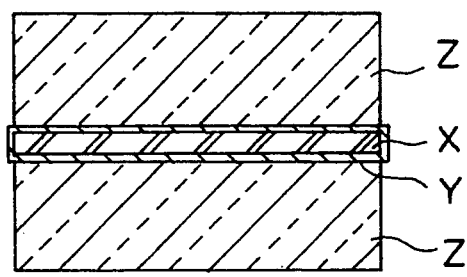

The examination for the amount of transition metals released from the silica is carried out by such a procedure as shown in FIG. 2(A) and FIG. 2(B). A silicon nitride film Y is formed on the surface of a silicon substrate X. A sample of a silica board Z is then contacted with the silicon nitride film Y. In such a state, the silicon substrate X and the silica board Z are left, for example in a nitrogen atmosphere at 1100üïC for 6 hours. Thus, the impurities in the silica board Z is allowed to be released in the silicon nitride film Y.

The above silicon nitride film Y is dissolved by a hydrofluoric acid solution, and the metal elements contained in the hydrofluoric acid solution are analyzed using an atomic absorption spectrometer.

The examined results are shown in Table 2. As is apparent from Table 2, the transition metals such as Fe, Cr, Ni and Cu are released in a large amount from the silica formed by the electrical fusion method, while the amount of the metal impurities released from the silica formed by the flame fusion method is very small.

TABLE 2

| METAL ELEMENT | Fe | Cr | Ni | Cu |
|---|---|---|---|---|
| FLAME FUSED SILICA | 9.4 | <0.52 | <2.3 | 20 |
| ELECTRICAL FUSED SILICA | 1500 | 4.9 | 49 | 1200 |

($\times 10^{10}$ atoms/cm$^2$)

It is revealed that the silica containing a small amount of the OH group has a strong bonding between the Si and O and is thus excellent in the heat resistance; however, it becomes the source of the metal contamination to a semiconductor wafer in the actual heat treatment. Also, as is apparent from Tables 1 and 2, the heat resistance and the released amount of impurities cannot be determined depending on the content of the transition metals.

The reason why the difference in the silica fabrication method exerts an influence on the released amount of contaminated metals under the high temperature heat treatment is as follows: namely, metal impurities in the silica are entrapped by the OH group in some form, which retards the diffusion rate of the metal impurities in the silica.

The present invention will be more apparent by way of the following embodiments with reference to the accompanying drawings.

Embodiment 1

Figure 3A:
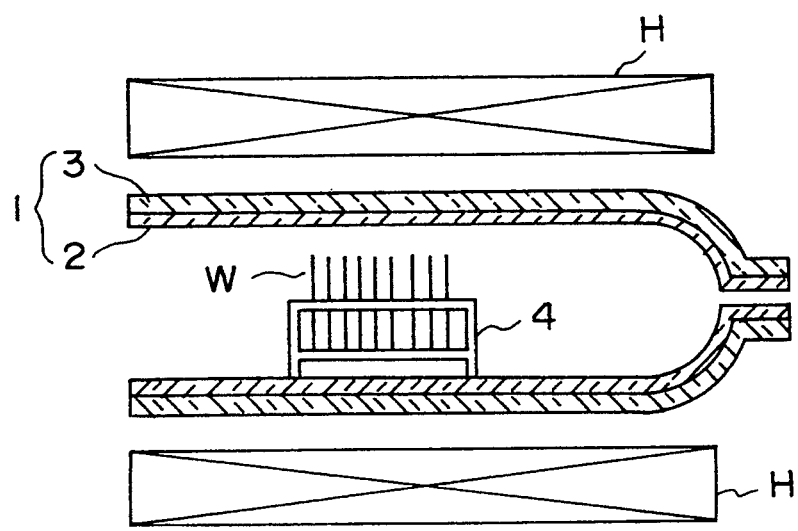
FIGS. 3(A) and 3(B) are sectional views each showing a furnace tube made of silica according to a first embodiment of the present invention used for a fabrication process for semiconductor devices.
Figure 3B:
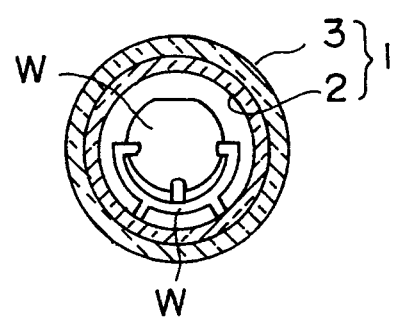

FIG. 3(A) is a sectional side view of an apparatus showing a first embodiment of the present invention; and FIG. 3(B) is a front view thereof.

In these figures, numeral 1 indicates a horizontal type furnace tube used in a film deposition apparatus and an annealer and the like. The furnace tube 1 has a two-layer structure with silica layers 2 and 3. The inner silica layer 2 is formed by the oxyhydrogen flame fusion method and contains the OH group in an amount of 100 ppm or more. The outer silica layer 3 is formed by, for example electrical fusion method and contains the OH group in an amount of 30 ppm or less.

The oxyhydrogen flame fusion method has a process of fusing silica sand or silica rock by a flame of the supplied oxygen and hydrogen. The silica thus formed contains a large amount of the OH group by the oxygen and hydrogen. On the contrary, the electrical fusion method has a process of fusing silica sand or silica rock in a vacuum atmosphere by a heater. The silica thus formed contains a small amount of the Oh group under the principle of the electrical fusion method.

In the case that the above furnace tube 1 is used for the film deposition apparatus or the heater for semiconductor device fabrication, it is surround by a heater H and contains a wafer boat 4 mounting semiconductor wafers W.

In such a furnace tube 1, the outer silica layer 3 contains a small amount of the OH group and metals such as Fe, Cu, Cr, Ni and the like in the respective amounts as shown in Table 1, and thereby the above metals tend to be diffused in the inner silica layer 2. However, the inner silica layer 2 contains a large amount of the OH group, and thereby the metals are entrapped in some form by a large amount of the OH group. This makes it possible to retard the diffusion rate of the metals, and hence to reduce the amount of the metals released to the inner space of the furnace tube 1.

For this reason, by the film formation apparatus and annealing apparatus using the furnace tube 1, it is possible to sufficiently suppress the contamination of the semiconductor wafers W.

In particular, the metal impurities, which are diffused through the wall of the furnace tube 1 from the heater wire constituting the heater H and permeated into the internal space of the furnace tube 1, are entrapped within the inner silica layer 2 having the small diffusion constant of the metals, thus substantially achieving the contamination blocking effect.

Also, the outer silica layer 3 has a small amount of the OH group, and is not soften at, for example 1100C, so that the furnace tube 1 itself is not deformed in the processes for semiconductor device fabrication.

In addition, for forming a furnace tube having a two layer structure, there are considered the following methods: One involves preparing two silica tubes in which the outer diameter of the inner tube and the inside diameter of the outer tube are different by about 1 mm; inserting the inner tube in the outer tube; and melting them by the burner or the like for integrating them. The other involves applying a powder such as silica sand or silica rock on the inner surface of the outer silica tube containing the small amount of the OH group; inserting the inner tube in the outer tube; and fusing them in an atmosphere of oxygen and hydrogen.

Next, there will be shown the results of analyzing the amount of the metals released from the silica board having the above-described two-layer structure.

The analysis was made using the contamination detecting wafer, that is, the silicon substrate X covered with the silicon nitride film Y used in obtaining the results shown in Table 2.

Figure 4:
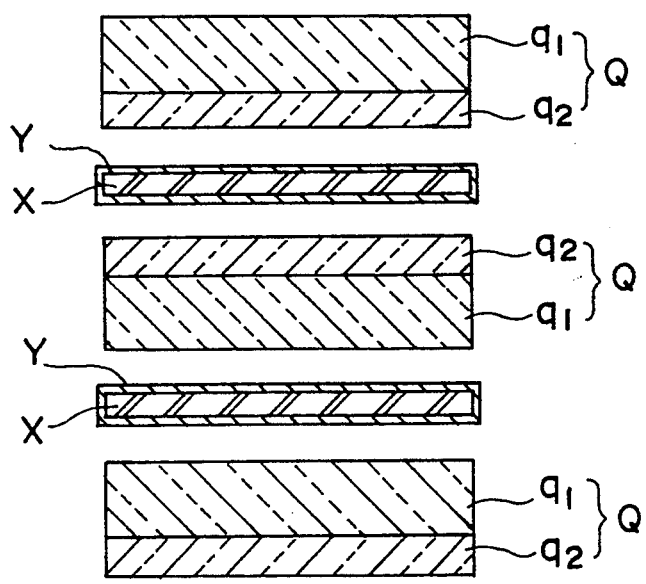
FIGS. 4(A) and 4(B) are sectional views each showing a method for examining the amount of impurities released from the silica layer used in the first embodiment of the present invention.
Figure 4:
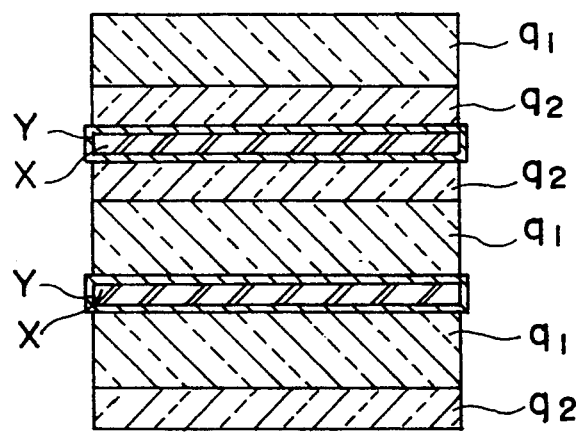

As shown in FIGS. 4(A) and 4(B), there were prepared three samples Q each having a two-layer structure constituting an electrical fused silica layer $q_1$ having a thickness of 4 mm and a flame fused silica layer $q_2$ having a thickness of 1 mm. A first contamination detecting wafer was held between the flame fused silica layers $q_2$ of the first and second samples Q, and further, a second contamination detecting wafer was held between the electrical fused silica layers $q_1$ of the second and third samples Q. These were left in a nitrogen atmosphere at 1100° C. for 6 hours.

The silicon nitride films Y of the two contamination detecting wafers were dissolved in the hydrofluoric acid solution, and were subjected to the atomic absorption spectrometry, which gave the results as shown in Table 3.

TABLE 3

| METAL ELEMENT | Fe | Cr | Ni | Cu |
|---|---|---|---|---|
| WAFER BETWEEN ELECTRICAL FUSED SILICA LAYERS | 3800 | 17 | 22 | 2700 |
| WAFER BETWEEN FLAME FUSED SILICA LAYERS | 130 | 0.55 | <2.1 | 180 |
| ($\times 10^{10}$ atoms/cm$^2$) | | | | |

Thus, it becomes apparent that the furnace tube having the outer layer constituted of the electric fused silica and the inner layer constituted of the flame fused silica is excellent in the heat resistance and is reduced in the amount of the metals released in the inside of the furnace tube. Further, the above furnace tube blocks metals released from the heater, and accordingly it is effectively applied to the process for semiconductor device fabrication.

In addition, with an increase in the thickness of the silica layer 3 formed by the electric fusion method, the heat resistance of the furnace tube 1 is improved. The same is true for the next embodiments.

Embodiment 2

Figure 5A:
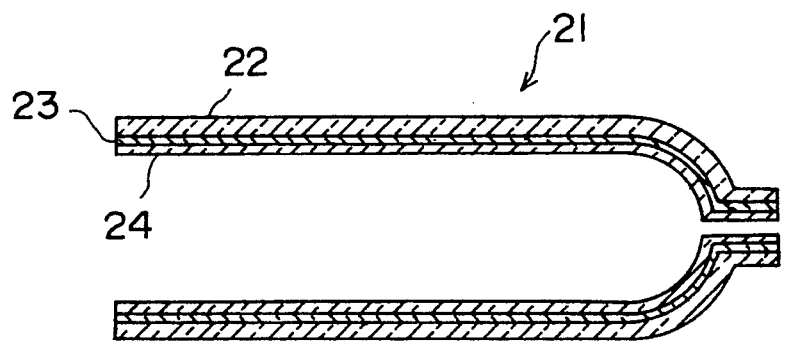
FIGS. 5(A) and 5(B) are sectional views each showing a silica made furnace tube according to a second embodiment of the present invention used for a fabrication process for semiconductor devices.
Figure 5B:
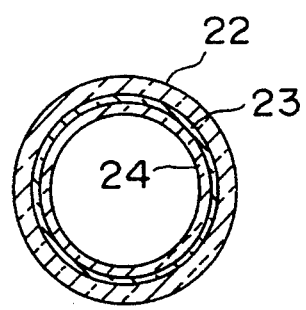

FIGS. 5(A) and 5(B) are a sectional side view and a sectional front view each showing a structure of a silica tube according to a second embodiment of the present invention.

In these figures, numeral 21 indicates a horizontal type furnace tube used for the film deposition apparatus, annealer and the like. The furnace tube 21 has a three-layer silica structure.

A first and outermost silica layer 22 is formed by the electric fusion method and contains the OH group in an amount of 30 ppm or less. A third and innermost silica layer 24 is formed by the oxyhydrogen flame fusion method and contains the OH group in an amount of 100 ppm or more. Further, a second silica layer 23 held between the silica layers 22 and 24 is a synthesis silica layer formed by a vapor deposition method, and contains the OH group in an amount of 200 ppm or more, which is larger than that of the third silica layer 24. In formation of the synthesis silica by the vapor deposition method, there is used a reaction gas composed of, for example $SiCl_4$, $H_2$ and $O_2$.

Just as the first embodiment 1, in the furnace tube 1 described above, since the innermost silica layer 24 contains a large amount of the OH group, the contaminated metals are entrapped therein in some form, which makes it possible to reduce the amount of the contaminated metals released to the inner space of the furnace tube 1.

Also, the metal impurities diffused from the electrical fused silica layer 22 or the metal impurities diffused to the furnace tube 1 from the outside such as the heater wire of the furnace and the like are reduced in the diffusion rate in the second synthesis silica layer 23, thereby making it possible to reduce the amount of the contaminated elements released into the tube as compared with the first embodiment.

In addition, as the content of the OH group in the synthesis silica layer 23 is made larger, the effect described above is increased.

The furnace tube constituted of the three-silica layer structure is excellent in the heat resistance and is substantially clean against the semiconductor wafers.

The results of analyzing the amounts of the metals released from the above silica board having the three-layer structure will be shown below.

For the analysis, there were used the contamination detecting wafers used for obtaining the results shown in Table 2, that is, the silicon substrate X covered with the silicon nitride Y.

Figure 6A:
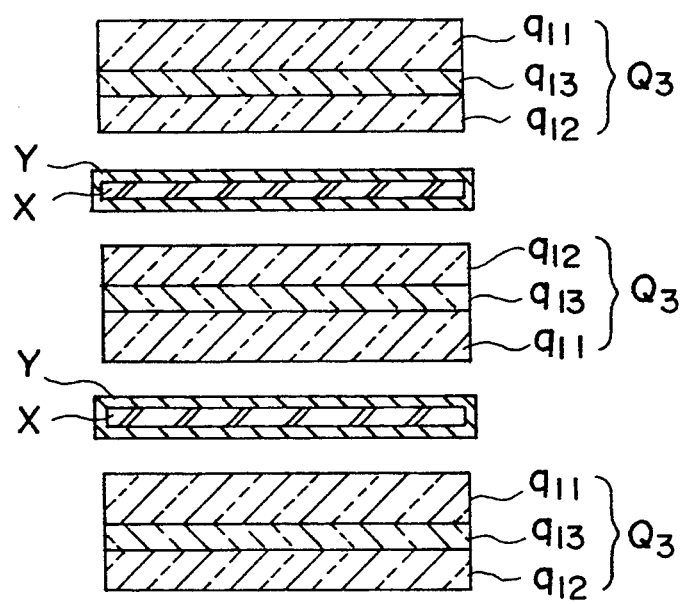
FIGS. 6(A) and 6(B) are sectional views each showing a method for examining the amount of impurities released from the silica layer used in the second embodiment of the present invention.
Figure 6B:
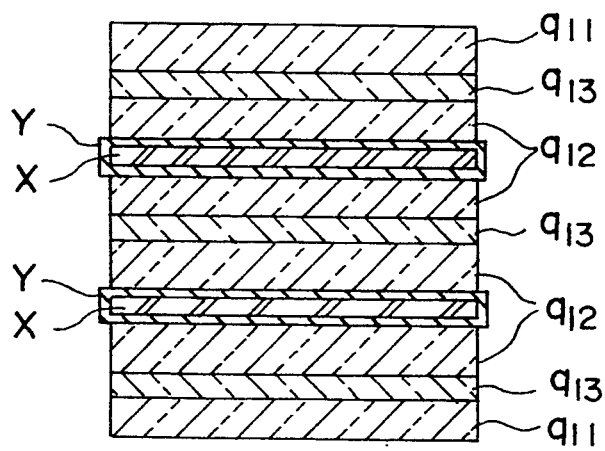

First, as shown in FIG. 6(A), there were prepared three samples $Q_3$ each having a three-layer structure constituting an electrical fused silica layer $q_{11}$ having a thickness of 5 mm, a flame fused silica layer $q_{12}$ having a thickness of 1 mm and a synthesis silica layer $q_{13}$ having a thickness of 5 mm. As shown in FIG. 6(B), a first contamination detecting wafer was held between the flame fused silica layers $q_{12}$ of the first and second samples $Q_3$, and further, a second contamination detecting wafer was held between the electrical fused silica layers $q_{11}$ of the second and third samples $Q_3$. These were left in a nitrogen atmosphere at 1100° C. for 6 hours.

The silicon nitride films Y of the two contamination detecting wafers were dissolved in the different hydrofluoric acid solutions, and are subjected to the atomic absorption spectrometer, which gave the results as shown in Table 4.

TABLE 4

| METAL ELEMENT | Fe | Cr | Ni | Cu |
|---|---|---|---|---|
| WAFER BETWEEN ELECTRICAL FUSED SILICA LAYERS | 3800 | 17 | 22 | 2700 |
| WAFER BETWEEN FLAME FUSED SILICA LAYERS | 11 | 3.4 | 3.1 | 36 |
| | | ($\times 10^{10}$ atoms/cm$^2$) | | |

As is apparent from Table 4, as compared with the silica board having the two-layer structure constituted of the electric fused silica layer and the flame fused silica layer used in the first embodiment, the silica board having the three-layer structure in which the synthesis silica is held therebetween becomes smaller in the amount of the released metals, and accordingly it is more effectively applied to the process for semiconductor device fabrication.

Embodiment 3

Figure 7A:
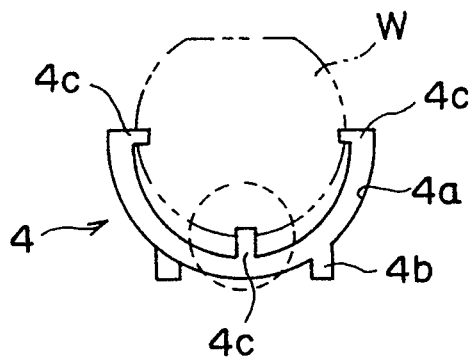
FIG. 7(A) is a front view showing a wafer basket according to a third embodiment of the present invention used for a fabrication process.
Figure 7B:
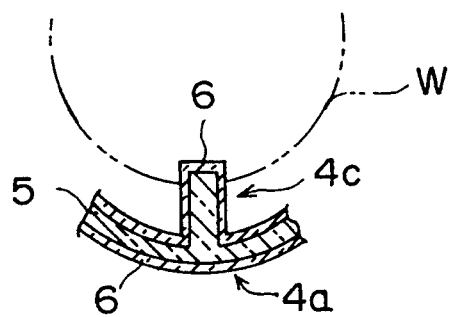
FIG. 7(B) is a partial sectional view of the wafer basket as shown in FIG. 7(A)
Figure 7C:
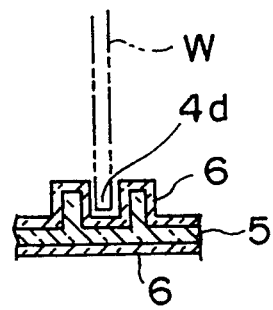
FIG. 7(C) is a sectional side view of the wafer basket as shown in 7(A)

FIG. 7(A) is a front view of the wafer basket 4 as shown in FIGS. 2(B) and 3(B); FIG. 7(B) is a partial sectional view of the broken line seen from the front surface; and FIG. 7(C) is a sectional side view thereof.

In the wafer basket 4 contained in a furnace tube 1, a plurality of flame bodies 4a, each being approximately U-shaped, are disposed to be spacedly parallel to each other. The bottom portion and both sides of the frame body 4a are integrated with each other by bar-like bridging portions (not shown), respectively. Legs 4b are provided on the bottom portion, and projections 4c and grooves 4d for supporting a semiconductor wafer W are formed on the inner side (closest to the wafer W) of the frame body 4a.

The wafer basket 4 is constituted of a silica layer 5 as a base body and an outer silica layer 6 covering the silica layer 5. The silica layer 5 as a base body is constituted of a silica material formed by the electrical fusion method, and contains the OH group in a small amount of 30 ppm or less so as not to be soften at temperatures over several hundreds ° C. Also, the silica layer 6 for covering is constituted of a silica material formed by the oxyhydrogen flame fusion method, and contains the OH group in an amount of 100 ppm or more.

Just as the first embodiment, by use of the above wafer basket 4, the heavy metals such as Fe, Cu and the like contained in natural silica are entrapped by a large amount of the OH group contained in the outer silica layer 6 and are thus difficult to be leaked. This makes it possible to extremely reduce the amount of the contamination of the semiconductor wafer W directly contacted with the outer silica layer 6. In this case, the thermal deformation is prevented by the silica layer 5 as a base body.

Figure 7D:
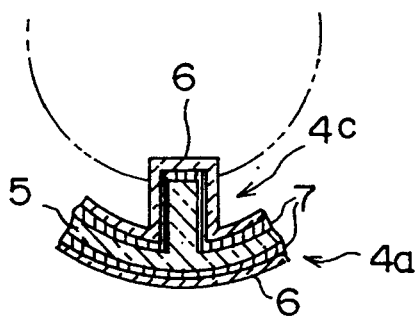
FIG. 7(D) is a partial sectional view of the wafer basket as shown in FIG. 7(A)
Figure 7E:
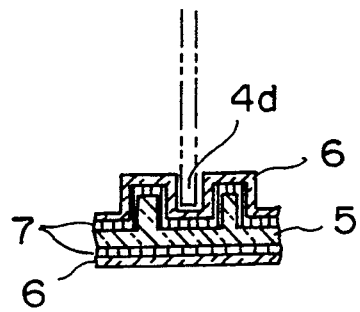
FIG. 7(E) is a sectional side view of the wafer basket as shown in FIG. 7(A)

In addition, as shown in FIGS. 7(D) and 7(E), by interposing a synthesis silica layer 7 formed by the vapor deposition method as an intermediate layer between the silica layer 5 as a base body and the silica layer 6 for covering, it is possible to further suppress the release of the impurities.

Embodiment 4

Figure 8A:
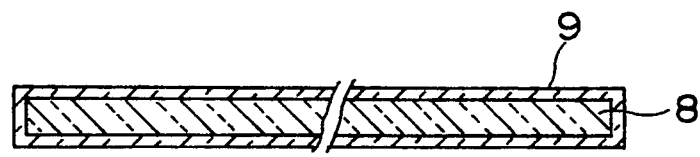
FIGS. 8(A) and 8(B) are sectional views each showing a stick according to a fourth embodiment of the present invention used for a fabrication process for semiconductor devices.

FIG. 8(A) is a sectional view of a fourth embodiment showing a stick made of silica used for semiconductor device fabrication.

The stick is constituted of a silica layer 8 constituting a core portion, and a silica layer 9 covering the whole. The silica layer 8 constituting the core portion contains the OH group in a small amount of, for example 30 ppm or less, and is formed by the electrical fusion method so as not to be soften in temperatures of several hundreds ° C. The silica layer 9 for covering is formed by the oxyhydrogen flame fusion method and contains the OH group in a large amount of, for example 100 ppm or more.

Just as in the above embodiments, the above stick makes it possible to suppress the leak of the metals such as Fe and Cu to the outside, and hence to extremely improve the amount of the contamination of the semiconductor wafer W.

Figure 8B:
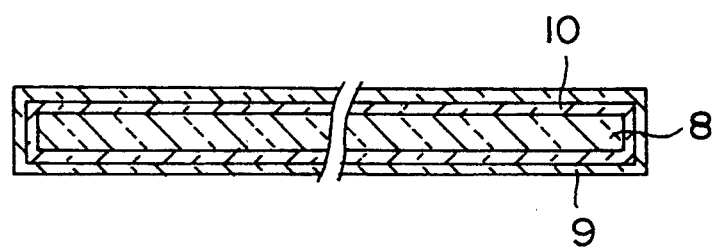

In addition, as shown in FIG. 8(B), there may be interposed a synthesis silica layer 10 between the silica layer 8 constituting the core portion and the silica layer 9 for covering. The synthesis silica layer 10 contains the OH group in an amount larger than that of the silica layer 9 for covering.

Other Embodiments

As for the apparatus made of silicaes other than those described above used in the process for semiconductor device fabrication, the silica layer as a base body is formed by the electrical fusion method to reduce the amount of the OH group, and the silica layer on the side (closest to the wafer side) faced to the semiconductor wafer is formed by the oxyhydrogen flame fusion method to increase the OH group, which covers the silica layer as a base body.

With this arrangement, it is possible to suppress the thermal deformation, and to reduce the introduction of impurities to the semiconductor wafer.

In addition, a synthesis silica may be interposed as an intermediate layer.

What is claimed is:

1. A apparatus made of silica for semiconductor device fabrication comprising:
   a first silica layer contacted with an atmosphere around a semiconductor wafer; and a second silica layer containing the hydroxyl group in an amount smaller than that contained in said first silica layer, which is formed on a portion not to be contacted with said atmosphere.

2. A apparatus made of silica for semiconductor device fabrication according to claim 1, wherein said first silica layer contains the hydroxyl group in an amount of 100 ppm or more, and said second silica layer contains the hydroxyl group in an amount of 30 ppm or less.

3. A apparatus made of silica for semiconductor device fabrication according to claim 1, wherein said first silica layer is constituted of a flame fused silica, and said second silica layer is constituted of an electrical fused silica.

4. A apparatus made of silica for semiconductor device fabrication according to claim 1, wherein said second silica layer is formed in a tubular shape, and said first silica layer is formed on the inner peripheral side of said second silica layer.

5. A apparatus made of silica for semiconductor device fabrication according to claim 4, wherein said first silica layer contains the hydroxyl group in an amount of 100 ppm or more, and said second silica layer contains the hydroxyl group in an amount of 30 ppm or less.

6. A apparatus made of silica for semiconductor device fabrication according to claim 4, wherein said first silica layer is constituted of a flame fused silica, and said second silica layer is constituted of an electrical fused silica.

7. A apparatus made of silica for semiconductor device fabrication according to claim 1, wherein said second silica layer is formed in a bar shape, and the surface thereof is covered with said first silica layer.

8. A apparatus made of silica for semiconductor device fabrication according to claim 7, wherein said first silica layer contains the hydroxyl group in an amount of 100 ppm or more, and said second silica layer contains the hydroxyl group in an amount of 30 ppm or less.

9. A apparatus made of silica for semiconductor device fabrication according to claim 7, wherein said first silica layer is constituted of a flame fused silica, and said second silica layer is constituted of an electrical fused silica.

10. A apparatus made of silica for semiconductor device fabrication according to claim 1, wherein a third silica layer is interposed between said first silica layer and said second silica layer, said third silica layer being constituted of a synthesis silica which is formed by a vapor deposition method and contains the hydroxyl group in an amount larger than that contained in said first silica layer.

11. A apparatus made of silica for semiconductor device fabrication according to claim 10, wherein said first silica layer contains the hydroxyl group in an amount of 100 ppm or more, said second silica layer contains the hydroxyl group in an amount of 30 ppm or less, and said third silica layer contains the hydroxyl group in an amount of 200 ppm or more.

12. A apparatus made of silica for semiconductor device fabrication according to claim 10, wherein said first silica layer is constituted of a flame fused silica, and said second silica layer is constituted of an electrical fused silica.

13. A apparatus made of silica for semiconductor device fabrication according to claim 10, wherein said second silica layer is formed in a tubular shape, and said first silica layer is formed inwardly of said second and third silica layers.

14. A apparatus made of silica for semiconductor device fabrication according to claim 13, wherein said first silica layer contains the hydroxyl group in an amount of 100 ppm or more, said second silica layer contains the hydroxyl group in an amount of 30 ppm or less, and said third silica layer contains the hydroxyl group in an amount of 200 ppm or more.

15. A apparatus made of silica for semiconductor device fabrication according to claim 13, wherein said first silica layer is constituted of a flame fused silica, and said second silica layer is constituted of an electrical fused silica.

16. A apparatus made of silica for semiconductor device fabrication according to claim 10, wherein said second silica layer is formed in a bar shape, and the outermost surface thereof is constituted of said first silica layer.

17. A apparatus made of silica for semiconductor device fabrication according to claim 16, wherein said first silica layer contains the hydroxyl group in an amount of 100 ppm or more, said second silica layer contains the hydroxyl group in an amount of 30 ppm or less, and said third silica layer contains the hydroxyl group in an amount of 200 ppm or more.

18. A apparatus made of silica for semiconductor device fabrication according to claim 16, wherein said first silica layer is constituted of a flame fused silica, and said second silica layer is constituted of an electrical fused silica.

19. A apparatus made of silica for semiconductor device fabrication comprising:
   a first silica layer formed on a portion contacted with a semiconductor wafer; and
   a second silica layer formed on a portion not contacted with said semiconductor wafer and containing the hydroxyl group in an amount smaller than that contained in said first silica layer.

20. A apparatus made of silica for semiconductor device fabrication according to claim 19, wherein said first silica layer contains the hydroxyl group in an amount of 100 ppm or more, and said second silica layer contains the hydroxyl group in an amount of 30 ppm or less.

21. A apparatus made of silica for semiconductor device fabrication according to claim 19, wherein said first silica layer is constituted of a flame fused silica, and said second silica layer is constituted of an electrical fused silica.

22. A apparatus made of silica for semiconductor device fabrication according to claim 19, wherein said second silica layer has a shape for mounting said semiconductor wafer, and the surface thereof is covered with said first silica layer.

23. A apparatus made of silica for semiconductor device fabrication according to claim 22, wherein said first silica layer contains the hydroxyl group in an amount of 100 ppm or more, and said second silica layer contains the hydroxyl group in an amount of 30 ppm or less.

24. A apparatus made of silica for semiconductor device fabrication according to claim 22, wherein said first silica layer is constituted of a flame fused silica, and said second silica layer is constituted of an electrical fused silica.

25. A apparatus made of silica for semiconductor device fabrication according to claim 19, wherein said second silica layer is formed in a bar shape, and the surface thereof is covered with said first silica layer.

26. A apparatus made of silica for semiconductor device fabrication according to claim 25, wherein said first silica layer contains the hydroxyl group in an amount of 100 ppm or more, and said second silica layer contains the hydroxyl group in an amount of 30 ppm or less.

27. A apparatus made of silica for semiconductor device fabrication according to claim 25, wherein said first silica layer is constituted of a flame fused silica, and said second silica layer is constituted of an electrical fused silica.

28. A apparatus made of silica for semiconductor device fabrication according to claim 19, wherein a third silica layer is interposed between said first silica layer and said second silica layer, said third silica layer being constituted of a synthesis silica which is formed by a vapor deposition method and contains the hydroxyl group in an amount larger than that contained in said first silica layer.

29. A apparatus made of silica for semiconductor device fabrication according to claim 28, wherein said first silica layer contains the hydroxyl group in an amount of 100 ppm or more, said second silica layer contains the hydroxyl group in an amount of 30 ppm or less, and said third silica layer contains the hydroxyl group in an amount of 200 ppm or more.

30. A apparatus made of silica for semiconductor device fabrication according to claim 28, wherein said first silica layer is constituted of a flame fused silica, and said second silica layer is constituted of an electrical fused silica.

31. A apparatus made of silica for semiconductor device fabrication according to claim 28, wherein said second silica layer has a shape for mounting a semiconductor wafer, and the outermost surface thereof is constituted of said first silica layer.

32. A apparatus made of silica for semiconductor device fabrication according to claim 31, wherein said first silica layer contains the hydroxyl group in an amount of 100 ppm or more, said second silica layer contains the hydroxyl group in an amount of 30 ppm or less, and said third silica layer contains the hydroxyl group in an amount of 200 ppm or more.

33. A apparatus made of silica for semiconductor device fabrication according to claim 31, wherein said first silica layer is constituted of a flame fused silica, and said second silica layer is constituted of an electrical fused silica.

34. A apparatus made of silica for semiconductor device fabrication according to claim 28, wherein said second silica layer is formed in a bar shape, and the outermost surface thereof is constituted of said first silica layer.

35. A apparatus made of silica for semiconductor device fabrication according to claim 34, wherein said first silica layer contains the hydroxyl group in an amount of 100 ppm or more, said second silica layer contains the hydroxyl group in an amount of 30 ppm or less, and said third silica layer contains the hydroxyl group in an amount of 200 ppm or more.

36. A apparatus made of silica for semiconductor device fabrication according to claim 34, wherein said first silica layer is constituted of a flame fused silica, and said second silica layer is constituted of an electrical fused silica.

* * * * *

UNITED STATES PATENT AND TRADEMARK OFFICE
CERTIFICATE OF CORRECTION

PATENT NO. :

DATED      :   5,395,452

INVENTOR(S) :   March 7, 1995

Kobayashi et al

It is certified that error appears in the above-indentified patent and that said Letters Patent is hereby corrected as shown below:

Column 1, line 55, delete "," after "is".

Column 7, line 49, delete "2(B)" and insert --3(A)--.

Signed and Sealed this

Thirtieth Day of May, 1995

Attest:

BRUCE LEHMAN

*Attesting Officer*          *Commissioner of Patents and Trademarks*

UNITED STATES PATENT AND TRADEMARK OFFICE
CERTIFICATE OF CORRECTION

PATENT NO. : 5,395,452
DATED : March 7, 1995
INVENTOR(S) : Kobayashi et al.

It is certified that error appears in the above-indentified patent and that said Letters Patent is hereby corrected as shown below:

IN THE ABSTRACT
    line 1, change "a" (first occurrence) to --an--.
    Fig. 3(B), change "W" at bottom to --4--.

Col. 1, line 7, change "a" to --an--;
    line 9, change "a" (first occurrence) to --an--
    line 18, change "An" to --A--.

Col. 2, line 30, change "a" to --an--;
    line 40, before "is" (second occurrence) insert --it--.

Col. 4, line 10, change "iiiC" to --°C--.
Col. 5, line 33, change "C" to --°C--.
Col. 7, line 68, change "° C" to --°C--.
Col. 8, line 32, change "° C" to --°C--
    line 65, change "A" to --An--.

Col. 9, line 5, change "A" to --An--;
    line 10, change "A" to --An--;
    line 15, change "A" to --An--;
    line 20, change "A" to --An--;
    line 25, change "A" to --An--;
    line 30, change "A" to --An--;
    line 34, change "A" to --An--;
    line 39, change "A" to --An--;
    line 44, change "A" to --An--;
    line 52, change "A" to --An--;
    line 59, change "A" to --An--;
    line 64, change "A" to --An--;

UNITED STATES PATENT AND TRADEMARK OFFICE
CERTIFICATE OF CORRECTION

PATENT NO. : 5,395,452
DATED : March 7, 1995
INVENTOR(S) : Kobayashi et al.

It is certified that error appears in the above-indentified patent and that said Letters Patent is hereby corrected as shown below:

Col. 10, line 14, change "A" to --An--;
    line 8, change "A" to --An--;
    line 13, change "A" to --An--;
    line 18, change "A" to --An--;
    line 25, change "A" to --An--;
    line 30, change "A" to --An--;
    line 38, change "A" to --An--;
    line 44, change "A" to --An--;
    line 49, change "A" to --An--;
    line 54, change "A" to --An--;
    line 60, change "A" to --An--;
    line 65, change "A" to --An--;
Col. 11, line 1, change "A" to --An--;
    line 7, change "A" to --An--;
    line 12, change "A" to --An--;
    line 20, change "A" to --An--;
    line 27, change "A" to --An--;
    line 32, change "A" to --An--;

UNITED STATES PATENT AND TRADEMARK OFFICE
CERTIFICATE OF CORRECTION

PATENT NO. : 5,395,452
DATED : March 7, 1995
INVENTOR(S) : Kobayashi et al.

It is certified that error appears in the above-indentified patent and that said Letters Patent is hereby corrected as shown below:

Col. 12, line 4, change "A" to --An--;
       line 11, change "A" to --An--;
       line 16, change "A" to --An--;
       line 21, change "A" to --An--;
       line 28, change "A" to --An--;

Signed and Sealed this

Fifth Day of March, 1996

Attest:

BRUCE LEHMAN

Attesting Officer    Commissioner of Patents and Trademarks